United States Patent [19]

Utsumi et al.

[11] Patent Number: 4,536,435
[45] Date of Patent: Aug. 20, 1985

[54] MULTILAYER SUBSTRATE INCLUDING LAYERS OF AN ALUMINA AND BOROSILICATE-LEAD-GLASS CERAMIC MATERIAL

[75] Inventors: Kazuaki Utsumi; Yuzo Shimada; Masanori Suzuki; Hideo Takamizawa, all of Tokyo, Japan

[73] Assignee: Nippon Electric Co., Ltd., Tokyo, Japan

[21] Appl. No.: 434,238

[22] Filed: Oct. 14, 1982

[30] Foreign Application Priority Data

Oct. 14, 1981 [JP] Japan ................. 56-164017

[51] Int. Cl.$^3$ .............................................. B32B 3/00
[52] U.S. Cl. .................................. 428/209; 428/210; 428/901; 428/432; 428/433; 428/434
[58] Field of Search ............... 428/209, 210, 901, 433, 428/434, 688, 689, 702, 697, 217, 427, 428, 432; 501/15, 17, 22, 75; 252/512, 513, 514

[56] References Cited

U.S. PATENT DOCUMENTS

| | | | |
|---|---|---|---|
| 3,944,696 | 3/1976 | Larry | 501/75 |
| 3,950,174 | 4/1976 | Suzuki et al. | 501/75 |
| 4,098,949 | 7/1978 | Keswiek | 428/210 |
| 4,131,478 | 12/1978 | Davis et al. | 501/15 |
| 4,199,704 | 4/1980 | Vaishneya et al. | 501/15 |
| 4,208,605 | 6/1980 | McVey et al. | 501/15 |
| 4,273,822 | 6/1981 | Bube | 428/901 |
| 4,317,856 | 3/1982 | Huthwelker et al. | 428/901 |
| 4,369,220 | 1/1983 | Prabhu et al. | 428/210 |
| 4,379,195 | 4/1983 | Prabhu et al. | 428/209 |
| 4,405,722 | 9/1983 | Kokubu et al. | 501/15 |
| 4,415,624 | 11/1983 | Prabhu et al. | 428/209 |

*Primary Examiner*—Josephine L. Barr
*Attorney, Agent, or Firm*—Laff, Whitesel, Conte & Saret

[57] ABSTRACT

A multilayer glass-ceramic substrate comprises insulator layers of a composition consisting essentially of, when components are expressed as oxides in percent by weight, 40–60 percent of aluminum oxide, 1–40 percent of lead oxide, 1–30 percent of boron oxide, 2–40 percent of silicon dioxide, 0.01–25 percent of at least one oxide of chemical element(s) of Group II of the periodic table, and 0.01–10 percent of at least one oxide of Group IV element(s) except carbon, silicon, and lead. Each insulator layer may be only from 190 microns down to 10 microns thick. The substrate has a flexural strength of 2,100 kg/cm$^2$ or more. Preferably, the Group II element(s) is magnesium, calcium, strontium, barium, and/or zinc. The Group IV element(s) is zirconium, titanium, germanium, and/or tin. When the percentages are 40–60 for aluminum oxide, 4.1–16.6 for lead oxide, 1.0–10.0 for boron oxide, 14.0–39.1 for silicon dioxide, 0.1–4.8 for magnesium oxide, 2.0–10.0 for calcium oxide, 0.05–3.0 for barium oxide, 0.01–3.0 for zirconium oxide, and 0.01–2.5 for titanium oxide, the substrate has a flexural strength of 3,000 kg/cm$^2$ or more and an interlayer leakage current of 8 microamperes or less. Each insulator layer has a structure of a vitreous network of borosilicate-lead series glass with the interstices occupied by crystals of aluminum oxide and microcrystalline structures which are obtained by reaction of aluminum oxide and glass of the borosilicate lead series.

5 Claims, No Drawings

MULTILAYER SUBSTRATE INCLUDING LAYERS OF AN ALUMINA AND BOROSILICATE-LEAD-GLASS CERAMIC MATERIAL

BACKGROUND OF THE INVENTION

This invention relates to a multilayer substrate including glass-ceramic insulator layers.

A multilayer ceramic substrate is for use in mounting a plurality of semiconductor chips directly thereon. Each semiconductor chip may be an IC or an LSI. The substrate comprises a plurality of ceramic layers as insulator layers and, between two adjacent insulator layers, a plurality of wirings for the semiconductor chips. The wirings are referred to also as circuit or conductor patterns.

Multilayer ceramic substrates are manufactured either by (A) a thick film printing method or (B) a green sheet method. The green sheet method is carried out either by (a) a laminating technique or (b) a printing technique.

The thick film printing method is widely put into practice. According to the thick film printing method, conductor layers for the wirings and insulator layers are alternatingly printed on a ceramic base. Each of the conductor and the insulator layers is fired or sintered after having been printed. The thick film printing method is therefore time consuming. It is difficult to manufacture an excellent substrate by reducing the dimensions of through or via holes formed through the insulator layers for the wirings, by rendering the wirings fine, and by stacking a desired number of insulator layers. In addition, it is difficult to attain a high yield of manufacture and a high reproducibility of the substrates.

According to the green sheet laminating technique, green sheets are successively laminated and then sintered or fired into insulator layers with the wirings printed on each green sheet before the successive laminating. In a conventional green sheet laminating technique, alumina is used as the insulating material. The laminated green sheets must therefore be sintered at as high a sintering or firing temperature as 1,500° C. or higher. In view of the high sintering temperature, the wirings must be made of molybdenum, tungsten, or a like conductor material having a high melting point.

For such a high melting point conductor material, sintering must be carried out in a reducing atmosphere as, for example, in a hydrogen furnace. Due to the necessity of a high sintering temperature and a reducing atmosphere, the installation for manufacture is large scale, expensive, and objectionable from the viewpoint of energy saving. Furthermore, the conventional green sheet laminating technique is defective because of a poor reproducibility and accordingly low yield.

The high melting point conductor material had a poor electrical conductivity. Each conductor for the wirings must therefore be appreciably thick. This results in considerably large dimensions of the wirings.

As will later be described in detail in the description of preferred embodiments of the instant invention, each green sheet has a thickness of 200 microns or more insofar as the conventional green sheet laminating technique is resorted to. It is therefore impractical to laminate a sufficient number of insulator layers. The smallest possible diameter of through holes is dependent on the thickness of each green sheet. Also in this respect, it has been difficult to achieve fine or minute wirings and consequently highly densed mounting of the semiconductor chips.

It is known to make the wirings including resistors and capacitors. In a multilayer ceramic substrate manufactured by the green sheet laminating technique, the resistors and/or the capacitors are fabricated according to the thick film printing method. For this purpose, thick film paste is fired at a temperature between 700° C. and 900° C. in air rather than in a reducing atmosphere. This unavoidably results in oxidation of the conductor material. It is not feasible to make each capacitor have a large electrostatic capacity because each insulator layer is appreciably thick as exemplified before. The electrostatic capacity is restricted to several hundred picofarads at most.

An approach to solve the problem of oxidation, is to plate gold on exposed surfaces of the conductor material. This is expensive and has not been widely put into practice.

Another approach is to improve the thick film paste so that firing may be carried out either in a neutral atmosphere or at a low temperature. Only a small number of varieties of the improved thick film paste are known. Moreover, the improved thick film paste is still defective and can not be used in practice because the paste raises an interlayer leakage current through the insulator layer, is unreliable, and renders the substrate poorly reproducible.

According to the green sheet printing technique, the remaining one of three schemes described hereinabove, an assembly is manufactured by printing layers of an insulating material on a green sheet together with interposed wirings. The assembly is subsequently fired. This makes it possible to fabricate thin insulator layers. It is, however, impossible to make the substrate have an appreciable number of insulator layers and to make the capacitors have a large electrostatic capacity.

Among the three schemes, it appears that the green sheet laminating technique is most promissing. The problem resides in the fact that a composition for fabricating the green sheets must be sintered into insulator layers at a considerably high sintering temperature.

In an attempt to lower the sintering temperature, glass is used in either the thick film printing or the green sheet methods and fired at a low sintering temperature into ceramic insulator layers, which are in fact glass or vitreous insulator layers. This attempt has, however, not successfully been put into practice because a multilayer glass or ceramic substrate manufactured thereby becomes porous to make the substrate have a high interlayer leakage current and a low thermal conductivity. In addition, it becomes difficult to find a conductor material which optimally matches with glass. This is because a number of bubbles appear in the wirings and in those portions of the glass insulator layers which lie on the wirings.

On the other hand, in general, it is mandatory for a multilayer substrate to have a sufficient mechanical strength to allow mounting thereon of the semiconductor chips and mounting thereof on apparatus in which the semiconductor chips are put into operation. It is known that a multilayer substrate should have a flexural strength which is not less than 2,000 kg/cm$^2$. In spite of this, known multilayer glass substrates have a flexural strength of 1,800 kg/cm$^2$ at most.

A multilayer glass substrate manufactured of a crystalline glass composition, has a poor thermal conductivity, such as 0.002 cal/cm.sec.°C. or less. This lengthens the signal propagation delay of the semiconductor chips mounted thereon. Such glass substrates are therefore inadequate for densely mounting the semiconductor chips thereon.

In the meanwhile, a multilayer glass-ceramic substrate is disclosed in U.S. Pat. No. 4,301,324 issued to Ananda H. Kumar et al and assigned to International Business Machines Corporation. A glass-ceramic article is characterized according to Kumar et al by a continuous glassy network composed of (A) beta-spodumene with the interstices of the network occupied by residual glass including crystallites of lithium metasilicate or (B) alpha-cordierite with the interstices occupied by residual glass including crystallites of clinoenstatite. The glass-ceramic article is excellent for use in composing glass-ceramic insulator layers in many respects. The substrate composed of the article is nevertheless still disadvantageous as regards the flexural strength and the thermal conductivity.

SUMMARY OF THE INVENTION

It is therefore a principal object of the present invention to provide a multilayer glass-ceramic substrate which can be manufactured at a relatively low firing or sintering temperature.

It is another principal object of this invention to provide a multilayer glass-ceramic substrate of the type described, in which each insulator layer is made relatively thin, such as only from 190 microns down to 10 microns thick.

It is still another principal object of this invention to provide a multilayer glass-ceramic substrate of the type described, which has a high flexural strength, such as 2,100 kg/cm$^2$ or more.

It is yet another principal object of this invention to provide a multilayer glass-ceramic substrate of the type described, which has an appreciably low interlayer leakage current.

It is a subordinate object of this invention to provide a multilayer glass-ceramic substrate of the type described, in which even copper, nickel, chromium, or a like conductor material can be used in fabricating wirings or circuit patterns.

It is another subordinate object of this invention to provide a multilayer glass-ceramic substrate of the type described, which can be manufactured even in an oxidizing atmosphere.

It is still another subordinate object of this invention to provide a multilayer glass-ceramic substrate of the type described, which is readily manufactured on a large scale and yet without expensive installation.

It is yet another subordinate object of this invention to provide a multilayer glass-ceramic substrate of the type described, which is manufactured with a high reproducibility, a high yield, and yet without expensive materials.

It is a further subordinate object of this invention to provide a multilayer glass-ceramic substrate of the type described, which can comprise a considerable number of layers.

It is a still further subordinate object of this invention to provide a multilayer glass-ceramic substrate of the type described, which can comprise highly densed circuit patterns.

It is a yet further subordinate object of this invention to provide a multilayer glass-ceramic substrate of the type described, on which it is possible to densely mount semiconductor chips.

It is a further subordinate object of this invention to provide a multilayer glass-ceramic substrate of the type described, in which a capacitor can be given a large electrostatic capacity.

Other objects of this invention will become clear as the description proceeds.

According to this invention, there is provided a multilayer substrate comprising a plurality of glass-ceramic insulator layers with interposed circuit patterns, wherein each glass-ceramic insulator layer has a composition consisting essentially of, when components of said composition are expressed as oxides, 40 through 60 percent by weight of aluminium oxide, 1 through 40 percent by weight of lead oxide, 1 through 30 percent by weight of boron oxide, 2 through 40 percent by weight of silicon dioxide, 0.01 through 25 percent by weight of at least one oxide selected from oxides of chemical elements of Group II of the periodic table, and 0.01 through 10 percent by weight of at least one oxide selected from oxides of chemical elements of Group IV of the periodic table except carbon, silicon, and lead.

Preferably, the oxides of the Group II chemical elements are magnesium oxide, calcium oxide, strontium oxide, barium oxide, and zinc oxide. The oxides of the Group IV chemical elements are zirconium dioxide, titanium dioxide, germanium dioxide, and stannic oxide.

Briefly speaking, this invention provides a multilayer substrate including a plurality of insulator layers of an alumina and borosilicate-lead-glass ceramic material.

DESCRIPTION OF THE PREFERRED EMBODIMENTS

A multilayer glass-ceramic substrate according to a preferred embodiment of the present invention is manufactured according to a conventional green sheet laminating technique. For this purpose, a composition which will later be described in detail, is dispersed in a solvent together with an organic binder to form a slurry. It may be mentioned for the time being that the composition is prepared by mixing or blending 40 through 60 percent by weight of aluminium oxide powder and glass powder of borosilicate lead series. A green sheet of a uniform thickness is formed of the slurry by the known doctor blading technique.

The green sheet is fired or sintered into a glass-ceramic insulator layer. When sintered, the composition becomes a continuous vitreous or glassy network of borosilicate-lead series glass. The network has a multiplicity of interstices, which are occupied by crystals of aluminium oxide and microcrystalline structures which are obtained by reaction of aluminium oxide and glass of the borosilicate lead series. The firing or sintering temperature may be 1,400° C. at the highest.

Inasmuch as the green sheet is sintered at the relatively low sintering temperature, it is possible to fabricate fine wirings or circuit patterns by using known conductor or metallic paste of gold, silver, platimum, palladium, copper, nickel, chromium, a like metallic element, or an alloy of at least one of such simple metals. Incidentally, the green sheet may have a thickness of the order of from 190 microns down to 10 microns.

It is believed that each microcrystalline structure grows as a result of chemical reaction of aluminium oxide with borosilicate-lead series glass, that crystallization of aluminium oxide takes place at the relatively low sintering temperature despite an appreciable content of aluminium oxide in the composition, and that the vitreous network concurrently grows with the chemical reaction and crystallization to be rendered integral with the crystals and the microcrystalline structures to form a dense crystalline phase having no voids. This gives the multilayer glass-ceramic substrate a high flexural strength of 2,100 kg/cm$^2$ or higher. The flexural strength may become as high as 4,000 kg/cm$^2$, which would be the highest limit attainable by such a crystalline phase. Furthermore, the substrate is given an appreciably low interlayer leakage current and a satisfactorily high thermal conductivity.

Let conventional multilayer glass substrates be reviewed, which are manufactured according to the thick film printing method by using a glass composition which is sinterable into a sintered glass insulator layer at a temperature between 600° C. and 800° C. It is impossible to print each glass layer to a sufficient thickness of preventing unavoidable formation of pin hols. Each sintered layer is, therefore, fabricated by two or three times repeating the printing of the glass layer and sintering of each printed glass layer. In addition to an additional waste of time, sheer or out of register is inevitable during the repeated printing for each glass insulator layer. This results in an objectionably low yield of such multilayer glass substrates.

Moreover, it is not feasible to press each printed glass layer in order to increase the density of the sintered layers. As printed on a ceramic base, the glass layer shrinks during the sintering process, but only in a direction of the thickness. This further adversely affects the density. Furthermore, voids are undesirably formed in the sintered layers. The low density results in a low electrical insulation. Combined with the low density, the voids result in a low thermal conductivity.

Even by the time consuming repetition of the glass layer printing and sintering processes, pin holes are unavoidable in each sintered glass insulator layer. The pin holes undesiredly raises the interlayer leakage current. The leakage current serves as a criterion for the reliability of a multilayer substrate. When measured as will later be described in detail, the interlayer leakage current should be 50 microamperes or less for ordinary applications of multilayer substrates and should be 10 microamperes or less when the substrate should be very reliable.

According to the green sheet laminating technique, it is possible to press, before sintering, an assembly of laminated green sheets in the direction of thickness together with the interposed conductor or metallic paste for the circuit patterns. The assembly is sintered in a free state in which shrinkage of the green sheets can occur in all directions of the thickness, the length, and the width. The density of the sintered insulator layers is raised to remarkably reduce the voids and the pin holes. This improves the electrical characteristics, such as the leakage current, the electrical insulation, and the withstanding voltage. In addition, this raises the thermal conductivity.

If alumina is used in fabricating green sheets, it is difficult to reduce the thickness below 200 microns as pointed out hereinbefore. This is for convenience of handling the green sheets. The handling is improved if the organic binder could be increased in the slurry. It might thereby become possible to fabricate a thin green sheet even by using alumina. The fact is, however, that an increased amount of the binder results in the necessity of a long continued binder removing or burning out process in an oxidizing atmosphere at a temperature between 500° C. and 600° C. This is harmful for the high melting point conductor material for the circuit patterns. Moreover, this deteriorates the electrical characteristics of the ceramic insulator layers. It has therefore been mandatory to make the green sheet have a thickness of 200 microns or more.

When laminated, a number of such thick green sheets render the substrate too thick or bulky. In addition, a thick substrate is disadvantageous in view of the thermal conduction or temperature propagation in the direction of thickness.

Circuit patterns are printed with known conductor paste on a green sheet by, for example, a conventional screen printing process. Before printing the conductor paste, through or via holes are formed through the green sheet ordinarily by a punching process with a punch and die. Alternatively, through holes are drilled through the green sheet. In either event, it is hardly possible to give each through hole a diameter which is smaller than the green sheet thickness. Each through hole formed in the green sheet therefore has a diameter of at least 200 microns.

In marked contrast, it is possible to give a thickness preferably between 10 microns and 150 microns to a green sheet fabricated according to the above-mentioned embodiment of this invention. This makes it possible to laminate a considerable number of green sheets without rendering the substrate too thick and poorly thermal conductive. Furthermore, this makes it possible to form through holes even with a diameter of a few scores of microns.

It is possible with the simple or the alloy metal for the circuit patterns to prepare the conductor paste of the fine metallic powder and to print thin conductors for the circuit patterns. Combined with the narrow through holes, this makes it possible to render the wirings fine or minute and to densely mount the semiconductor chips on the substrate.

The reason why the green sheets are made thin, resides entirely in the fact that the composition of the glass-ceramic insulator layer is decided as described above according to this invention. More particularly, it is possible to increase the amount of the organic binder in the green sheets if desired. It is made possible, without any adverse effects on the materials for the wirings, to remove the binder at a temperature between 500° C. and 600° C. even in a non-reducing atmosphere.

In a green sheet laminating technique for a conventional multilayer substrate, the firing of the conductor paste does not well match the sintering of the green sheets due to the discrepancy between temperatures for the conductor paste and the green sheets and in shrinkage thereof. As a result, cracks, peeling off of the insulator layer, flexion or warp thereof, and deformation of the substrate occur during the sintering process. This adversely affects the reliability and the yield.

In contrast, the above-specified oxides of chemical elements of Groups II and IV of the periodic table are advantageous in reducing the voids in the sintered glass-ceramic layers to improve the interlayer leakage current, the thermal conductivity, the electrical insulation, and the withstanding voltage. These oxides are favorable also in reducing occurrences of cracks and other deformation during the sintering process. It is believed that the oxides of the Group II and IV elements are effective in giving rise to simultaneous firing of the conductor paste and sintering of the green sheets and in reducing the discrepancy in shrinkage to make the conductor patterns tenaciously adhere to the glass-ceramic insulator layers.

Obviously, resistors and/or capacitors are conveniently formed together with the wirings. Inasmuch as it is possible to fabricate thin glass-ceramic insulator layers and to stack many insulator layers, the capacitor can be given a large electrostatic capacity, such as several microfarads or more.

Preferred examples of the compositions and the multilayer glass-ceramic substrates will now be described.

Powder of aluminium oxide and powder of borosilicate-lead series glass were weighed to provide, when components are expressed as oxides, various compositions listed below in percent by weight in Tables 1 and 2 as samples Nos. 1 through 54. In Table 1, the oxides of chemical elements of Group II and IV of the periodic table are given in totals, respectively, for each sample. The oxides of the Group II and IV chemical elements are shown in detail in Table 2 for the respective samples with the samples numbered as in Table 1. The percentages of components of each composition given in Tables 1 and 2 are within the limits of the composition specified hereinabove.

TABLE 1

| Sample | $Al_2O_3$ | PbO | $B_2O_3$ | $SiO_2$ | Oxide(s) of Group II element(s) | Oxide(s) of Group IV element(s) |
| --- | --- | --- | --- | --- | --- | --- |
| 1 | 60 | 1.0 | 10.3 | 23.7 | 4.0 | 1.0 |
| 2 | 60 | 23.1 | 1.0 | 8.59 | 6.4 | 0.91 |
| 3 | 60 | 25.24 | 8.3 | 2.0 | 2.55 | 1.91 |
| 4 | 60 | 13.8 | 7.6 | 6.3 | 9.3 | 3.0 |
| 5 | 55 | 21.3 | 3.9 | 4.0 | 11.1 | 4.7 |
| 6 | 50 | 8.3 | 3.4 | 32.5 | 3.0 | 0.55 |
| 7 | 50 | 10.0 | 5.0 | 28.3 | 6.1 | 0.6 |
| 8 | 50 | 12.0 | 4.5 | 27.99 | 0.01 | 5.5 |
| 9 | 50 | 9.5 | 10.3 | 7.3 | 20.0 | 2.9 |
| 10 | 50 | 23.1 | 15.4 | 7.49 | 4.0 | 0.01 |
| 11 | 50 | 11.0 | 8.3 | 5.7 | 15.0 | 10.0 |
| 12 | 50 | 22.1 | 3.8 | 16.4 | 2.7 | 5.0 |
| 13 | 50 | 32.1 | 3.5 | 7.2 | 6.2 | 1.0 |
| 14 | 50 | 11.3 | 25.1 | 8.0 | 2.4 | 3.2 |
| 15 | 50 | 2.8 | 1.1 | 39.1 | 5.5 | 1.5 |
| 16 | 50 | 8.4 | 5.6 | 2.1 | 25.0 | 7.0 |
| 17 | 45 | 18.4 | 10.2 | 3.9 | 15.1 | 7.4 |
| 18 | 40 | 14.5 | 13.6 | 2.5 | 24.8 | 4.6 |
| 19 | 40 | 11.0 | 16.4 | 12.8 | 12.7 | 7.1 |
| 20 | 40 | 40.0 | 4.0 | 4.5 | 10.0 | 1.5 |
| 21 | 40 | 10.7 | 30.0 | 7.0 | 10.2 | 2.1 |
| 22 | 40 | 6.0 | 1.2 | 40.0 | 10.5 | 2.3 |
| 23 | 55 | 7.5 | 4.1 | 30.2 | 2.7 | 0.5 |
| 24 | 55 | 7.5 | 3.1 | 27.2 | 4.69 | 2.51 |
| 25 | 40 | 16.6 | 1.0 | 39.1 | 2.7 | 0.6 |
| 26 | 60 | 4.1 | 10.0 | 14.0 | 8.0 | 3.9 |
| 27 | 45 | 8.5 | 3.1 | 29.1 | 10.15 | 4.15 |
| 28 | 50 | 10.0 | 8.5 | 20.0 | 9.0 | 2.5 |
| 29 | 40 | 13.0 | 6.0 | 25.8 | 12.19 | 3.01 |
| 30 | 50 | 5.0 | 2.2 | 32.5 | 7.79 | 2.51 |
| 31 | 50 | 8.2 | 3.4 | 32.4 | 1.0 | 4.9 |
| 32 | 50 | 8.2 | 3.4 | 32.4 | 1.5 | 4.4 |
| 33 | 50 | 8.2 | 3.4 | 32.4 | 2.0 | 3.9 |
| 34 | 50 | 8.2 | 3.4 | 32.4 | 3.0 | 2.9 |
| 35 | 50 | 8.2 | 3.4 | 32.4 | 3.0 | 2.9 |
| 36 | 50 | 8.2 | 3.4 | 32.4 | 3.0 | 2.9 |
| 37 | 50 | 8.2 | 3.4 | 32.4 | 3.0 | 2.9 |
| 38 | 50 | 8.2 | 3.4 | 32.4 | 3.0 | 2.9 |
| 39 | 50 | 8.2 | 3.4 | 32.4 | 3.0 | 2.9 |
| 40 | 50 | 8.2 | 3.4 | 32.4 | 3.0 | 2.9 |
| 41 | 50 | 8.2 | 3.4 | 32.4 | 3.0 | 2.9 |
| 42 | 50 | 8.2 | 3.4 | 32.4 | 3.0 | 2.9 |
| 43 | 50 | 8.2 | 3.4 | 32.4 | 3.0 | 2.9 |
| 44 | 50 | 8.2 | 3.4 | 32.4 | 3.0 | 2.9 |
| 45 | 50 | 8.3 | 3.4 | 32.4 | 3.0 | 2.9 |
| 46 | 50 | 8.3 | 3.4 | 32.4 | 3.0 | 2.9 |
| 47 | 50 | 8.3 | 3.4 | 32.4 | 3.0 | 2.9 |
| 48 | 50 | 8.3 | 3.4 | 32.4 | 3.0 | 2.9 |
| 49 | 50 | 8.3 | 3.4 | 32.4 | 3.0 | 2.9 |
| 50 | 50 | 8.3 | 3.4 | 32.4 | 3.0 | 2.9 |
| 51 | 50 | 8.3 | 3.4 | 32.4 | 3.0 | 2.9 |
| 52 | 50 | 8.3 | 3.4 | 32.4 | 3.0 | 2.9 |
| 53 | 50 | 8.3 | 3.4 | 32.4 | 3.0 | 2.9 |
| 54 | 50 | 8.3 | 3.4 | 32.4 | 3.0 | 2.9 |

TABLE 2

| Sample | Oxide(s) of element(s) of Group II | | | | | Oxide(s) of element(s) of Group IV | | | |
| --- | --- | --- | --- | --- | --- | --- | --- | --- | --- |
| | MgO | CaO | SrO | BaO | ZnO | $ZrO_2$ | $TiO_2$ | $GeO_2$ | $SnO_2$ |
| 1 | 1.1 | 2.4 | — | 0.4 | 0.1 | 0.4 | 0.6 | — | — |
| 2 | 0.5 | 4.0 | — | 0.8 | 1.1 | 0.9 | 0.01 | — | — |
| 3 | 0.7 | 0.05 | — | 0.5 | 1.3 | 0.01 | 1.9 | — | — |
| 4 | 1.1 | 4.2 | — | — | 4.0 | 1.1 | 1.9 | — | — |
| 5 | 3.2 | 3.9 | — | 1.6 | 2.4 | 1.5 | 3.2 | — | — |
| 6 | 0.2 | 2.7 | — | 0.1 | — | 0.45 | 0.1 | — | — |
| 7 | 0.5 | 5.5 | — | 0.1 | — | 0.5 | 0.1 | — | — |
| 8 | — | 0.01 | — | — | — | 3.0 | 2.5 | — | — |
| 9 | 5.0 | 5.0 | 2.3 | 4.5 | 3.2 | 1.1 | 1.8 | — | — |
| 10 | 0.3 | 0.2 | 1.1 | 0.1 | 0.5 | 0.01 | — | — | — |
| 11 | 4.2 | 8.0 | 1.9 | 0.6 | 0.3 | 5.0 | 5.0 | — | — |
| 12 | — | — | 1.5 | 1.2 | — | 2.0 | 3.0 | — | — |
| 13 | — | — | 3.0 | — | 3.2 | — | 1.0 | — | — |
| 14 | — | 2.4 | — | — | — | — | 3.2 | — | — |
| 15 | — | — | 4.0 | 1.5 | — | 1.5 | — | — | — |
| 16 | 6.8 | 10.0 | — | 8.2 | — | 4.0 | 3.0 | — | — |
| 17 | 10.0 | 1.5 | — | 1.9 | 1.7 | 3.3 | 4.1 | — | — |
| 18 | 4.7 | 6.3 | — | 10.0 | 3.8 | 2.1 | 2.5 | — | — |
| 19 | 3.2 | 7.1 | — | 0.6 | 1.8 | 2.1 | 5.0 | — | — |
| 20 | — | 5.0 | — | 3.0 | 2.0 | 0.5 | 1.0 | — | — |
| 21 | 1.6 | 3.0 | — | 5.0 | 0.6 | 0.7 | 1.4 | — | — |
| 22 | 2.3 | 2.2 | — | 1.0 | 5.0 | 0.8 | 1.5 | — | — |
| 23 | 0.2 | 2.4 | — | 0.1 | — | 0.4 | 0.1 | — | — |
| 24 | 2.2 | 2.4 | — | 0.09 | — | 2.5 | 0.01 | — | — |
| 25 | 0.2 | 2.4 | — | 0.1 | — | 0.3 | 0.3 | — | — |
| 26 | 2.5 | 5.0 | — | 0.5 | — | 2.5 | 1.4 | — | — |
| 27 | 0.1 | 10.0 | — | 0.05 | — | 2.15 | 2.0 | — | — |

TABLE 2-continued

| Sample | Oxide(s) of element(s) of Group II | | | | | Oxide(s) of element(s) of Group IV | | | |
|---|---|---|---|---|---|---|---|---|---|
| | MgO | CaO | SrO | BaO | ZnO | $ZrO_2$ | $TiO_2$ | $GeO_2$ | $SnO_2$ |
| 28 | 4.8 | 1.2 | — | 3.0 | — | 1.5 | 1.0 | — | — |
| 29 | 3.1 | 8.0 | — | 1.09 | — | 3.0 | 0.01 | — | — |
| 30 | 1.1 | 6.5 | — | 0.19 | — | 0.01 | 2.5 | — | — |
| 31 | 1.0 | — | — | — | — | 2.9 | 2.0 | — | — |
| 32 | — | — | 1.5 | — | — | — | 2.4 | 1.0 | 1.0 |
| 33 | — | — | — | 2.0 | — | 1.0 | 1.0 | — | 1.9 |
| 34 | — | — | — | — | 3.0 | — | 1.0 | 1.0 | 0.9 |
| 35 | 1.0 | 2.0 | — | — | — | — | — | 2.9 | — |
| 36 | 1.6 | — | 1.4 | — | — | — | — | — | 2.9 |
| 37 | 1.7 | — | — | 1.3 | — | — | — | 1.4 | 1.5 |
| 38 | 0.9 | — | — | — | 2.1 | 1.8 | — | — | 1.1 |
| 39 | — | 2.3 | 0.7 | — | — | 1.9 | — | 1.0 | — |
| 40 | — | 2.9 | — | 0.1 | — | — | 1.5 | 1.4 | — |
| 41 | — | 2.2 | — | — | 0.8 | 0.7 | — | 1.3 | 0.9 |
| 42 | — | — | 1.6 | — | 1.4 | — | 1.0 | 0.6 | 1.3 |
| 43 | — | — | — | 1.8 | 1.2 | 0.7 | 0.7 | — | 1.5 |
| 44 | 1.0 | 0.7 | 0.3 | — | — | 1.3 | 1.2 | 0.4 | — |
| 45 | 1.1 | — | 0.9 | 1.0 | — | 0.6 | 1.1 | 0.3 | 0.9 |
| 46 | 1.3 | — | 1.2 | — | 0.5 | 0.6 | 1.3 | 0.5 | 0.5 |
| 47 | 0.8 | — | — | 0.5 | 1.7 | 0.6 | 0.1 | 1.3 | 0.9 |
| 48 | — | 1.4 | 0.7 | 0.9 | — | 0.6 | 0.7 | 1.2 | 0.4 |
| 49 | — | 0.8 | 1.1 | — | 1.1 | 1.5 | 0.2 | 0.6 | 0.6 |
| 50 | — | — | 0.4 | 0.9 | 1.7 | 0.4 | 1.6 | 0.5 | 0.4 |
| 51 | — | 0.7 | 0.9 | 0.9 | 0.5 | 0.7 | 0.2 | 0.9 | 1.1 |
| 52 | 0.5 | — | 1.1 | 0.6 | 0.8 | 1.3 | 0.3 | 1.1 | 0.2 |
| 53 | 0.8 | 0.3 | 0.9 | — | 1.0 | 0.4 | 0.1 | 1.1 | 1.3 |
| 54 | 0.6 | 0.7 | 1.3 | 0.4 | — | 0.1 | 1.9 | 0.6 | 0.3 |

The weighed powders were subjected to wet blending or mixing to provide a mixture in a ball mill during, for example, 24 hours. Together with an organic binder, the mixture was suspended in a solvent to form a slurry. The binder may be polyvinyl butylal, polyvinyl alcohol, or an acrylic resin. The solvent may be ethylene glycol monoethyl ether.

Green sheets of a uniform thickness between 10 microns and 190 microns were formed of the slurry by resorting to the known doctor blading technique. The green sheets of various uniform thicknesses were cut or blanked into rectangular sheets having a common area of 60 mm × 40 mm. In compliance with the wirings to be formed for the semiconductor chips, through or via holes were formed through the rectangular sheets by the punch and die. Conductor or metallic paste was applied onto the punched sheets by the known screen printing process. The conductor paste included gold, silver, platinum, palladium, copper, nickel, chromium, a gold palladium alloy, a silver gold alloy, a silver palladium alloy, or the like.

The printed sheets and, as the case may be, the rectangular sheets with no prints were laminated into laminates so as to form desired circuits for the semiconductor chips. The numbers of laminated green sheets are listed below in Table 3 for the respective samples numbered as in Tables 1 and 2. After hot compressed, the laminates were shaped as desired by a cutter. Each shaped laminate was sintered either in air or in a nitrogen atmosphere for one hour at a sintering or firing temperature between 700° C. and 1,400° C. as listed in Table 3 in °C. Before attaining the sintering temperature, the binder was completely removed or burnt out by maintaining each shaped laminate at about 500° C. in the non-reducing atmosphere for five hours. It is to be noted that the sample No. 20 was sintered at as low a temperature as 500° C. because of a considerable content of lead oxide. Incidentally, the lowest sintering temperature for other samples listed in Tables 1 and 2 is 800° C. Other samples not shown in Tables 1 and 2 were manufactured. Each of these samples has a similar composition and has proven to be similarly favorable.

In Table 3, data concerning the conductor patterns are also shown. Metals listed in Table 3 for the circuit patterns are only gold, silver, platinum, palladium, copper, nickel, chromium, a gold palladium alloy, a silver gold alloy, and a silver palladium alloy. Other alloys mentioned above have also been used. It has been confirmed that samples in which other alloys were used, gave as favorable results as the samples numbered 1 through 54 did in the flexural strength, in the interlayer leakage current, in the thermal conductivity, and in other respects as will presently be described. The width of each conductor in the patterns, the distance between two adjacent conductors, and the diameter of through holes are given in microns.

TABLE 3

| | Sintering | | Number of Green Sheets | Circuit Patterns | | | |
|---|---|---|---|---|---|---|---|
| Sample | Temperature | Atmosphere | | Metal | Width of each conductor | Distance between conductors | Diameter of via holes |
| 1 | 1,400 | air | 5 | Pt | 100 | 80 | 100 |
| 2 | 970 | air | 5 | Ag—Pd | 200 | 100 | 100 |
| 3 | 930 | air | 10 | Au | 150 | 100 | 150 |
| 4 | 1,150 | air | 25 | Au—Pd | 150 | 50 | 150 |
| 5 | 1,050 | air | 10 | Pd | 100 | 80 | 100 |
| 6 | 1,000 | air | 5 | Au | 80 | 80 | 80 |

TABLE 3-continued

| Sample | Sintering Temperature | Sintering Atmosphere | Number of Green Sheets | Metal | Width of each conductor | Distance between conductors | Diameter of via holes |
|---|---|---|---|---|---|---|---|
| 7 | 980 | air | 10 | Au | 50 | 50 | 50 |
| 8 | 950 | air | 10 | Ag—Au | 150 | 100 | 150 |
| 9 | 950 | air | 20 | Au | 100 | 50 | 100 |
| 10 | 930 | air | 25 | Ag | 100 | 50 | 100 |
| 11 | 930 | air | 20 | Ag—Pd | 50 | 100 | 50 |
| 12 | 910 | air | 30 | Ag—Pd | 50 | 100 | 50 |
| 13 | 910 | air | 10 | Ag | 50 | 80 | 50 |
| 14 | 910 | air | 20 | Ag | 50 | 80 | 50 |
| 15 | 900 | air | 25 | Ag | 100 | 100 | 130 |
| 16 | 900 | air | 10 | Ag—Au | 150 | 100 | 150 |
| 17 | 850 | air | 40 | Au | 100 | 50 | 100 |
| 18 | 830 | air | 30 | Ag | 100 | 50 | 100 |
| 19 | 800 | air | 50 | Ag | 50 | 100 | 50 |
| 20 | 500 | air | 5 | Ag | 50 | 80 | 50 |
| 21 | 810 | air | 5 | Ag | 50 | 100 | 50 |
| 22 | 920 | air | 5 | Ag | 100 | 100 | 130 |
| 23 | 900 | air | 40 | Au | 80 | 100 | 100 |
| 24 | 900 | air | 30 | Ag—Pd | 80 | 100 | 100 |
| 25 | 900 | air | 10 | Au | 80 | 100 | 100 |
| 26 | 950 | air | 10 | Au | 100 | 80 | 100 |
| 27 | 880 | air | 10 | Ag—Pd | 100 | 80 | 100 |
| 28 | 880 | air | 20 | Ag—Pd | 100 | 80 | 100 |
| 29 | 850 | air | 20 | Ag—Pd | 80 | 100 | 100 |
| 30 | 890 | air | 20 | Ag—Pd | 80 | 100 | 100 |
| 31 | 1,000 | air | 10 | Ag—Pd | 100 | 80 | 100 |
| 32 | 970 | air | 10 | Ag—Pd | 100 | 80 | 100 |
| 33 | 970 | air | 10 | Ag—Pd | 100 | 80 | 100 |
| 34 | 970 | air | 10 | Ag—Pd | 100 | 80 | 100 |
| 35 | 970 | air | 10 | Au | 80 | 50 | 80 |
| 36 | 960 | air | 10 | Au | 80 | 50 | 80 |
| 37 | 960 | air | 15 | Au | 80 | 50 | 80 |
| 38 | 960 | air | 15 | Au | 80 | 50 | 80 |
| 39 | 960 | nitrogen | 15 | Cu | 80 | 50 | 80 |
| 40 | 900 | nitrogen | 15 | Cu | 150 | 100 | 150 |
| 41 | 900 | nitrogen | 15 | Cu | 150 | 100 | 150 |
| 42 | 900 | nitrogen | 15 | Cu | 150 | 100 | 150 |
| 43 | 900 | air | 15 | Ni | 150 | 100 | 150 |
| 44 | 940 | air | 15 | Ni | 150 | 100 | 150 |
| 45 | 940 | air | 15 | Ni | 150 | 100 | 150 |
| 46 | 940 | air | 15 | Ni | 150 | 100 | 150 |
| 47 | 940 | air | 5 | Cr | 150 | 100 | 150 |
| 48 | 940 | air | 5 | Cr | 150 | 100 | 150 |
| 49 | 940 | air | 5 | Cr | 150 | 100 | 150 |
| 50 | 950 | air | 5 | Cr | 150 | 100 | 150 |
| 51 | 950 | air | 10 | Ag | 100 | 80 | 100 |
| 52 | 950 | air | 10 | Ag | 100 | 80 | 100 |
| 53 | 950 | air | 10 | Ag | 100 | 80 | 100 |
| 54 | 950 | air | 10 | Ag | 100 | 80 | 100 |

In Table 4, which follows, the flexural strength, the interlayer leakage current, and the thermal conductivity are listed in kg/cm$^2$, microamperes, and cal/cm.sec. °C., respectively, for the samples numbered as in Tables 1 through 3. Table 4 additionally shows occurrence of flexion or warp in the multilayer substrate during the sintering process and presence of bubbles in the substrate.

The interlayer leakage current, as herein called, was measured in the following manner. At first, a printed green sheet was formed by screen printing a square conductor layer, 30 mm×30 mm wide, of silver-palladium conductor paste on one of the principal surfaces of a blanked rectangular green sheet, together with a lead conductor layer of the paste. The lead conductor layer was led to an edge of the rectangular green sheet. A laminate was fabricated by laminating a desired number of other rectangular green sheets, the printed green sheet, and another rectangular green sheet of a thickness of 50 microns with the 50-micron thick green sheet placed on the above-mentioned one principal surface and with the other principal surface of the printed green sheet put on the other rectangular green sheets. A test sample was manufactured by sintering the laminate and thereafter firing an external electrode to the sintered lead conductor layer at the edge of the printed green sheet. The test sample was put in a 5-percent aqueous solution of sodium chloride, in which an opposing electrode was put. The leakage current was now measured by applying a d.c. voltage of 10 volt between the external electrode and the opposing electrode.

TABLE 4

| Sample | Flexural strength | Leakage current | Thermal conductivity | Flection and/or Deformation | Bubbles |
|---|---|---|---|---|---|
| 1 | 2,300 | 45 | 0.040 | none | none |
| 2 | 2,200 | 40 | 0.025 | none | none |
| 3 | 2,100 | 39 | 0.019 | none | none |
| 4 | 2,500 | 35 | 0.025 | none | none |
| 5 | 2,500 | 33 | 0.025 | none | none |
| 6 | 3,100 | 1 | 0.020 | none | none |

TABLE 4-continued

| Sample | Flexural strength | Leakage current | Thermal conductivity | Flection and/or Deformation | Bubbles |
|---|---|---|---|---|---|
| 7 | 3,100 | less than 1 | 0.015 | none | none |
| 8 | 2,700 | 31 | 0.013 | none | none |
| 9 | 2,800 | 31 | 0.030 | none | none |
| 10 | 2,600 | 29 | 0.014 | none | none |
| 11 | 2,600 | 25 | 0.013 | none | none |
| 12 | 2,400 | 25 | 0.015 | none | none |
| 13 | 2,700 | 35 | 0.012 | none | none |
| 14 | 2,400 | 40 | 0.013 | none | none |
| 15 | 2,500 | 41 | 0.013 | none | none |
| 16 | 2,500 | 42 | 0.013 | none | none |
| 17 | 2,600 | 25 | 0.020 | none | none |
| 18 | 2,800 | 29 | 0.015 | none | none |
| 19 | 2,600 | 28 | 0.015 | none | none |
| 20 | 2,500 | 25 | 0.009 | none | none |
| 21 | 2,300 | 29 | 0.0012 | none | none |
| 22 | 2,200 | 30 | 0.0010 | none | none |
| 23 | 3,500 | less than 1 | 0.020 | none | none |
| 24 | 3,300 | less than 1 | 0.025 | none | none |
| 25 | 3,100 | 5 | 0.015 | none | none |
| 26 | 3,150 | 5 | 0.030 | none | none |
| 27 | 3,200 | 8 | 0.015 | none | none |
| 28 | 3,000 | 1 | 0.020 | none | none |
| 29 | 3,000 | 1 | 0.015 | none | none |
| 30 | 3,100 | 3 | 0.020 | none | none |
| 31 | 2,700 | 42 | 0.021 | none | none |
| 32 | 2,400 | 41 | 0.025 | none | none |
| 33 | 2,400 | 40 | 0.015 | none | none |
| 34 | 2,500 | 40 | 0.013 | none | none |
| 35 | 2,600 | 42 | 0.031 | none | none |
| 36 | 2,300 | 43 | 0.010 | none | none |
| 37 | 2,300 | 41 | 0.012 | none | none |
| 38 | 2,600 | 41 | 0.021 | none | none |
| 39 | 2,800 | 40 | 0.029 | none | none |
| 40 | 2,500 | 40 | 0.030 | none | none |
| 41 | 2,600 | 42 | 0.025 | none | none |
| 42 | 2,600 | 42 | 0.013 | none | none |
| 43 | 2,700 | 40 | 0.017 | none | none |
| 44 | 2,700 | 40 | 0.022 | none | none |
| 45 | 2,500 | 45 | 0.014 | none | none |
| 46 | 2,600 | 47 | 0.016 | none | none |
| 47 | 2,800 | 45 | 0.011 | none | none |
| 48 | 2,500 | 43 | 0.018 | none | none |
| 49 | 2,500 | 45 | 0.021 | none | none |
| 50 | 2,400 | 46 | 0.023 | none | none |
| 51 | 2,600 | 48 | 0.016 | none | none |
| 52 | 2,700 | 45 | 0.014 | none | none |
| 53 | 2,800 | 45 | 0.013 | none | none |
| 54 | 2,300 | 46 | 0.019 | none | none |

Although not listed in Tables 1 and 2 and consequently in Tables 3 and 4, other samples were manufactured as references with compositions varied outside of the percentages specified hereinabove. In the following, such samples will be described with the component chemical elements expressed as the oxides of the respective elements.

When aluminium oxide was less than 40 percent by weight, the samples had flexural strengths less than 2,100 kg/cm². Moreover, the samples had smaller thermal conductivities.

When aluminium oxide was more than 60 percent by weight, it was necessary to sinter the laminated rectangular green sheets at higher sintering temperatures. Otherwise, it was impossible to form satisfactorily vitreous networks and to give the samples sufficient flexural strength.

When lead oxide was either less than 1 percent by weight or more than 40 percent by weight, it was infeasible to carry out the sintering process satisfactorily When boron oxide was less than 1 percent by weight, the glass-ceramic insulator layers of the samples has many voids. This rendered the samples unreliable.

When boron oxide was more than 30 percent by weight, the samples were moisture absorbing and had objectionable electrical insulation in humid astospheres.

When silicon dioxide was less than 2 percent by weight, it was hardly possible to satisfactorily sinter the laminates.

When silicon dioxide was more than 40 percent by weight, the flexural strength was 2,000 kg/cm² or less. In addition, the samples has smaller thermal conductivity.

When the oxide(s) of the chemical element(s) of Group II of the periodic table was less than 0.01 percent by weight, the glass-ceramic insulator layers of the samples had many voids. The samples were less reliable.

When the oxide(s) was more than 25 percent by weight, cracks occurred in the samples during the sintering process.

When the oxide(s) of the chemical element(s) of Group IV of the periodic table was less than 0.01 percent by weight, considerable deformation of the samples occurred during the sintering process.

When the oxide(s) was more than 10 percent by weight, the wirings did not tenaciously adhere to the glass-ceramic insulator layers.

Among the oxides of the Group II chemical elements, magnesium oxide, calcium oxide, strontium oxide, barium oxide, and zinc oxide are preferred because these oxides gave stably reproducible multilayer glass-ceramic substrates. Furthermore, these oxides are scarcely objectionable because they are little poisonous.

Among the oxides of the Group IV chemical elements, oxides of carbon, silicon, and lead are already excluded from the percentage between 0.01 and 10 percent by weight, both inclusive. Zirconium dioxide, titanium dioxide, germanium dioxide, and stannic oxide are preferred because they are less expensive. In this respect, other oxides of the Group IV elements are objectionable.

Reviewing Tables 1 through 4, it is preferred that the components of the compositions be within the following percentages when expressed as oxides.

When lead oxide was between 2.8 and 32.1 percent by weight, both inclusive, the laminated rectangular green sheets were readily sintered into non-porous glass-ceramic insulator layers. The reproducibility of the multilayer glass-ceramic substrates was better. The yield is accordingly higher.

When boron oxide was more than 25.1 percent by weight as exemplified by the sample No. 21, the thermal conductivity suddenly decreased below 0.01 cal/cm.-sec. °C. It is therefore preferred that boron oxide be 1.0 percent by weight or more and be not in excess of 25.1 percent by weight.

When silicon dioxide was less than 4.5 percent by weight as shown in the samples Nos. 3, 5, and 16–18, it has not been very easy to favorably control the sintering process although the fact is not clear from Tables 3 and 4. Such a strict control of the profile of temperature change during the sintering process is in contradiction to the requirements of large-scale production of the multilayer glass-ceramic substrates. When silicon dioxide was more than 39.1 percent by weight as exemplified by the sample No. 22, the thermal conductivity suddenly decreased below 0.01 cal/cm.sec. °C. A range between 4.5 and 39.1 percent by weight, both inclusive, is therefore preferred.

When the composition includes less than 0.03 percent by weight of magnesium oxide and less than 0.02 percent by weight of calcium oxide, it was the general tendency that many bubbles were present in the glass-ceramic insulator layers to undesiredly raise the leakage current and to appreciably deteriorate the reliability of the multilayer glass-ceramic substrates. When the composition includes more than 10.0 percent by weight of each of manganese and calcium oxides, it was difficult to control the profile of the sintering process. More specifically, the glass-ceramic insulator layer became porous depending on the profile. This adversely affects the yield of large-scale production of the multilayer glass-ceramic substrates. It is therefore preferred that the oxide(s) of the Group II chemical element(s) be 0.03 through 10.0 percent by weight of magnanese oxide and 0.02 through 10.0 percent by weight of calcium oxide.

Let zirconium dioxide be used as the oxide of only one chemical element of Group IV except the oxides of carbon, silicon, and lead. When the content was less than 0.01 percent by weight, deformation of the sample grew appreciable during the sintering process. When the content was more than 5.0 percent by weight, it was the tendency that the wirings less tenaciously adhered to the glass-ceramic insulator layers. It is therefore preferred that the composition includes 0.01 through 5.0 percent by weight of zirconium dioxide.

It has been confirmed that the samples, such as listed at Nos. 6, 7, and 23 through 30, comprising glass-ceramic insulator layers of the following most preferred compositions had flexural strengths of 3,000 kg/cm$^2$ or greater and interlayer leakage currents of 8 microamperes or less. Furthermore, the multilayer glass-ceramic substrates comprising such glass-ceramic insulator layers were very reliable in other respects.

The most preferred compositions consist essentially of, when components of the compositions are expressed as oxides, 40 through 60 percent by weight of aluminium oxide, 4.1 through 16.6 percent by weight of lead oxide, 1.0 through 10.0 percent by weight of boron oxide, 14.0 through 39.1 percent by weight of silicon dioxide, 0.1 through 4.8 percent by weight of magnesium oxide, 2.0 through 10.0 percent by weight of calcium oxide, 0.05 through 3.0 percent by weight of barium oxide, 0.01 through 3.0 percent by weight of zirconium dioxide, and 0.01 through 2.5 percent by weight of titanium dioxide.

It has also been confirmed that similar technical merits are achieved even when the crystalline phase coexists at a part of the glass-ceramic insulator layer with either or both of an amorphous and a vitreous phase. The composition may include less than 5 percent by weight of an oxide or oxides of alkali metal(s) without adverse effects on the advantages of the multilayer glass-ceramic substrates according to this invention. Although samples were manufactured as the examples and the references by using aluminium oxide powder and borosilicate-lead-series glass powder, it is possible to manufacture equally favorable multilayer glass-ceramic substrates by using, as some parts or the whole of each composition, either the respective oxides of the composition or those compounds which are readily sintered into the glass-ceramic insulator layers of the composition. It is likewise possible to resort to the thick film printing method or to the green sheet printing technique.

What is claimed is:

1. A multilayer substrate comprising a plurality of glass-ceramic insulator layers with interposed circuit patterns, wherein each glass-ceramic insulator layer has a composition consisting essentially of, when components of said composition are expressed as oxides, 40 through 60 percent by weight of aluminum oxide, 1 through 40 percent by weight of lead oxide, 1 through 30 percent by weight of boron oxide, 2 through 40 percent by weight of silicon dioxide, 0.01 through 25 percent by weight of at least one oxide selected from oxides of chemical elements of magnesium, calcium, strontium, barium and zinc, and 0.01 through 10 percent by weight of at least one oxide selected from oxides of chemical element of zirconium, titanium, germanium, and tin.

2. A multilayer substrate comprising a plurality of glass-ceramic insulator layers with interposed circuit patterns, wherein each glass-ceramic insulator layer has a composition consisting essentially of, when components of said composition are expressed as oxides, 40 through 60 percent by weight of aluminium oxide, 2.8 through 32.1 percent by weight of lead oxide, 1.0 through 25.1 percent by weight of boron oxide, 4.5 through 39.1 percent by weight of silicon dioxide, 0.03 through 10.0 percent by weight of magnesium oxide, 0.02 through 10.0 percent by weight of calcium oxide, and 0.01 through 5.0 percent by weight of zirconium oxide.

3. A multilayer substrate comprising a plurality of glass-ceramic insulator layers with interposed circuit patterns, wherein each glass-ceramic insulator layer has a composition consisting essentially of, when components of said composition are expressed as oxides, 40 through 60 percent by weight of aluminium oxide, 4.1 through 16.6 percent by weight of lead oxide, 1.0 through 10.0 percent by weight of boron oxide, 14.0 through 39.1 percent by weight of silicon dioxide, 0.1 through 4.8 percent by weight of magnesium oxide, 2.0 through 10.0 percent by weight of calcium oxide, 0.05 through 3.0 percent by weight of barium oxide, 0.01 through 3.0 percent by weight of zirconium oxide, and 0.01 through 2.5 percent by weight of titanium oxide.

4. A multilayer substrate comprising a plurality of glass-ceramic insulator layers with interposed circuit patterns, wherein each glass-ceramic insulator layer has a structure of a vitreous network of borosilicate-lead series glass having a multiplicity of interstices which are occupied by crystals of aluminium oxide and microcrystalline structures of a mixture of aluminium oxide and glass of the borosilicate lead series.

5. A multilayer substrate as claimed in any one of claims 2, 3, or 4, wherein said substrate has a flexural strength between 2,100 and 4,000 kg/cm$^2$.

* * * * *